United States Patent
Otsuka et al.

(10) Patent No.: US 12,047,092 B2
(45) Date of Patent: Jul. 23, 2024

(54) CHECKSUM ADDITION METHOD, CHECKSUM ADDITION DEVICE, AND SENSOR SYSTEM

(71) Applicant: MINEBEA MITSUMI Inc., Nagano (JP)

(72) Inventors: Shinya Otsuka, Tokyo (JP); Kosuke Yamamoto, Tokyo (JP)

(73) Assignee: MINEBEA MITSUMI Inc., Nagano (JP)

( * ) Notice: Subject to any disclaimer, the term of this patent is extended or adjusted under 35 U.S.C. 154(b) by 56 days.

(21) Appl. No.: 17/906,511

(22) PCT Filed: Mar. 26, 2021

(86) PCT No.: PCT/JP2021/013001
§ 371 (c)(1),
(2) Date: Sep. 16, 2022

(87) PCT Pub. No.: WO2021/205910
PCT Pub. Date: Oct. 14, 2021

(65) Prior Publication Data
US 2023/0179227 A1  Jun. 8, 2023

(30) Foreign Application Priority Data

Apr. 9, 2020  (JP) ................................ 2020-070471

(51) Int. Cl.
*H03M 13/09* (2006.01)
(52) U.S. Cl.
CPC ................................ *H03M 13/096* (2013.01)

(58) Field of Classification Search
CPC .................................................. H03M 13/096
See application file for complete search history.

(56) References Cited

U.S. PATENT DOCUMENTS

| | | | | |
|---|---|---|---|---|
| 4,703,473 A | * | 10/1987 | Caine | H04L 12/403 379/22 |
| 5,182,752 A | * | 1/1993 | DeRoo | G06F 11/08 714/E11.032 |
| 6,467,060 B1 | * | 10/2002 | Malakapalli | G11B 20/1813 |
| 7,647,544 B1 | * | 1/2010 | Masiewicz | G11B 20/1879 360/53 |
| 9,569,303 B2 | * | 2/2017 | Maeda | G06F 11/1004 |

(Continued)

FOREIGN PATENT DOCUMENTS

| JP | 2013-058845 | 3/2013 |
|---|---|---|
| JP | 2014-023013 | 2/2014 |

OTHER PUBLICATIONS

Extended European Search Report mailed on May 11, 2023 with respect of the corresponding European patent application No. 21784582.5.

(Continued)

*Primary Examiner* — Joseph D Torres
(74) *Attorney, Agent, or Firm* — IPUSA, PLLC

(57) ABSTRACT

A checksum addition method includes obtaining a command and an address transmitted from a request source; reading data from the address according to the command; calculating a checksum to be added to the data; and transmitting the checksum and the data to the request source, wherein the calculating calculates the checksum in a data unit according to a type of the command.

6 Claims, 7 Drawing Sheets

(56) References Cited

U.S. PATENT DOCUMENTS

| | | | |
|---|---|---|---|
| 2012/0324320 A1 | 12/2012 | Terabe et al. | |
| 2014/0025936 A1 | 1/2014 | Morikawa | |
| 2014/0075265 A1* | 3/2014 | Hung | G06F 11/1084 714/763 |
| 2017/0060680 A1* | 3/2017 | Halbert | G06F 3/064 |
| 2020/0274952 A1* | 8/2020 | Waskiewicz | H04L 69/22 |

OTHER PUBLICATIONS

NXP Semiconductors: "Application note AN12731: 8-bit CRC calculation procedure using SPI communication for the FXPS7xxxD4 pressure sensor—Rev. 1", Apr. 1, 2020 (Apr. 1, 2020), pp. 1-14, XP093041602, Retrieved from the Internet: URL:https://community.nxp.com/pwmxy87654/attachments/pwmxy87654/sensors/6638/1/AN12731.pdf.

SanDisk: "SanDisk Secure Digital Card Product Manual Version 1.9 Document No. 80-13-00169", Internet Citation, Dec. 1, 2003 (Dec. 1, 2003), page Complete, XP007907830, Retrieved from the Internet: URL:http://www.cs.ucr.edu/~amitra/sdcard/ProdManualSDCardv1.9.pdf.

International Search Report for PCT/JP2021/013001 mailed on Jun. 8, 2021.

Silicon Laboratories Inc., "I2C Humidity and Temperature Sensor", [online], Mar. 30, 2020, Internet: <https://www.silabs.com/documents/public/data-sheets/Si7006-A20.pdf>.

Office Action mailed on Apr. 2, 2024 with respect to the corresponding Japanese patent application No. 2020-070471.

* cited by examiner

CHECKSUM ADDITION METHOD, CHECKSUM ADDITION DEVICE, AND SENSOR SYSTEM

TECHNICAL FIELD

The present invention relates to a checksum addition method, a checksum addition device, and a sensor system.

BACKGROUND ART

In Non-Patent Document 1 cited below, a technique related to an IC equipped with a temperature sensor and a humidity sensor is disclosed, that reads sensor data stored in a register in response to an external command, calculates a checksum, and transmits the sensor data and the checksum to the outside.

RELATED ART DOCUMENTS

Non-Patent Documents

Non-Patent Document 1: Silicon Laboratories Inc., "I2C HUMIDITY AND TEMPERATURE SENSOR", [online], [retrieved on Mar. 30, 2020], Internet https://www.silabs.com/documents/public/data-sheets/Si7006-A20.pdf

SUMMARY OF THE INVENTION

Problem to be Solved by the Invention

However, in the conventional technique, when transmitting data read in response to a command transmitted from a request source to the request source, a checksum cannot be added to the data by a method that would be more appropriate for the type of command.

Means for Solving Problem

A checksum addition method according to one embodiment includes a command obtaining step of obtaining a command and an address transmitted from a request source; a data reading step of reading data from the address according to the command; a checksum calculating step of calculating a checksum to be added to the data; and a data transmitting step of transmitting the checksum and the data to the request source, wherein the checksum calculating step calculates the checksum in a data unit according to a type of the command.

Advantageous Effects of the Invention

By the checksum addition method according to the one embodiment, when transmitting data read in response to a command transmitted from a request source to the request source, a checksum can be added to the data by a method that is more appropriate for the type of command.

EMBODIMENTS FOR CARRYING OUT THE INVENTION

In the following, with reference to the drawings, one embodiment will be described.

(Configuration of Detection System 10)

Figure 1:
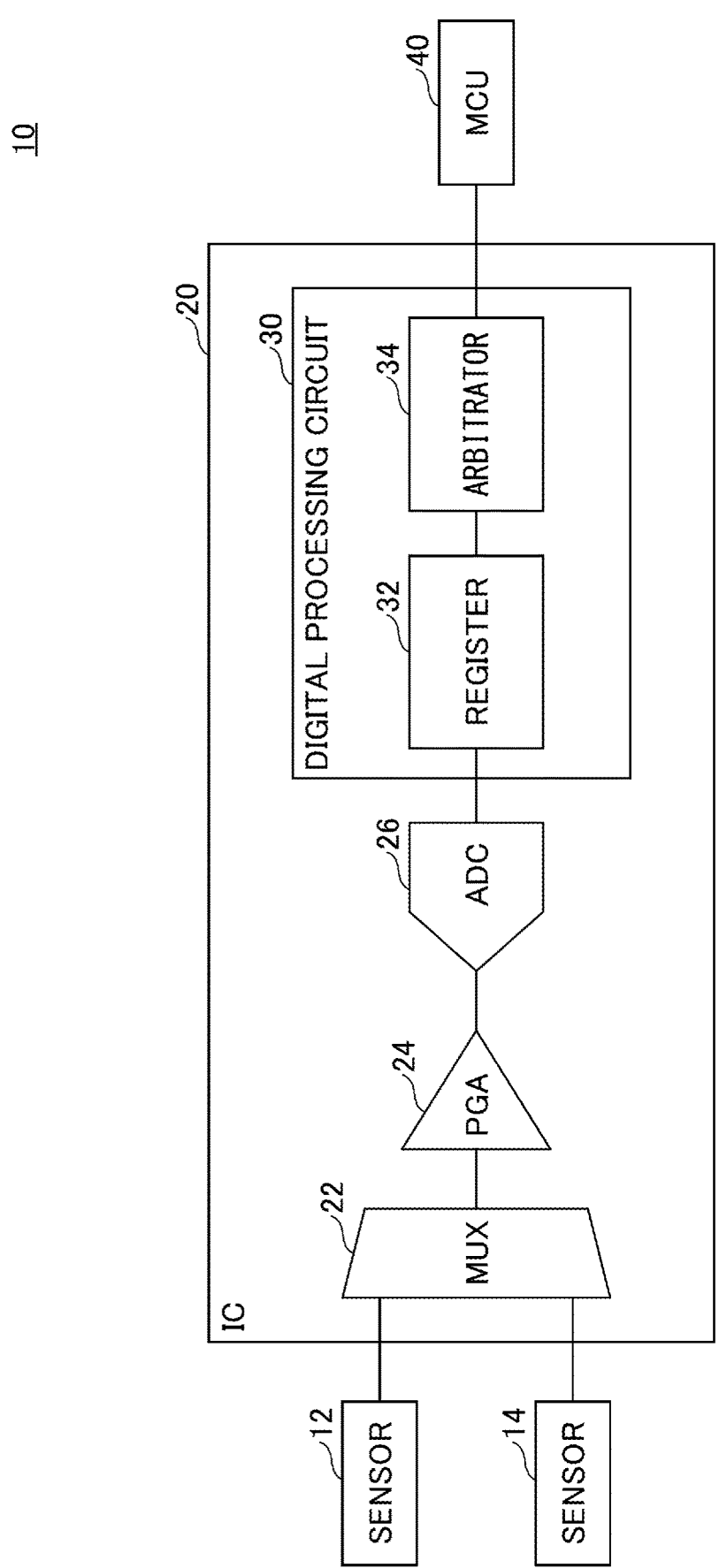
FIG. 1 is a diagram illustrating a configuration of a detection system according to the one embodiment.

FIG. 1 is a diagram illustrating a configuration of a detection system 10 according to the one embodiment (an example of a "sensor system"). The detection system 10 illustrated in FIG. 1 includes a sensor 12, a sensor 14, an integrated circuit (IC) 20, and a microcontroller unit (MCU) 40.

The sensors 12 and 14 detect various targets to be detected (e.g., temperature, strain, and the like). A differential sensor or a single-ended sensor can be used as the sensors 12 and 14. Note that the number of sensors may be three or more, and may be provided inside the IC 20.

The IC 20 is an integrated circuit that executes predetermined processing on sensor signals output from the sensors 12 and 14. For example, the IC 20 can amplify a sensor signal output from the sensor 12 or 14, and then, convert the signal from an analog signal into a digital signal, and store the digital signal in the register 32.

The MCU 40 is an example of a "request source" and an "external device", and by transmitting a READ command or a WRITE command to a communication unit 34 of the IC 20 via I2C communication, can read and write information on the register 32 of the IC 20. For example, the MCU 40 can read sensor data from the register 32 of the IC 20 by transmitting a READ command to the communication unit 34, and execute predetermined digital processing using the sensor data.

(Configuration of IC 20)

As illustrated in FIG. 1, the IC 20 includes a multiplexer 22, a programmable gain amplifier (PGA) 24, an A-D converter 26, and a digital processing circuit 30.

The multiplexer 22 is connected to the sensors 12 and 14. The multiplexer 22 selects either one of the sensor signals output from the sensors 12 and 14, and outputs the selected sensor signal to the PGA 24.

The PGA 24 is connected to the output terminal of the multiplexer 22. The PGA 24 is an amplifier whose gain can be changed. The PGA 24 amplifies the sensor signal output from the multiplexer 22, and outputs the amplified sensor signal to the A-D converter 26.

The A-D converter 26 is connected to the output terminal of the PGA 24. The A-D converter 26 converts the sensor signal output from the PGA 24 from an analog signal to a digital signal, and outputs the digital signal to the digital processing circuit 30.

The digital processing circuit 30 is connected to the output terminal of the A-D converter 26. The digital processing circuit 30 includes a register 32 and the communication unit 34. The digital processing circuit 30 executes predetermined digital signal processing on the sensor signal (digital signal) output from the A-D converter 26. For example, the digital processing circuit 30 stores the sensor signal (i.e., sensor data) output from the A-D converter 26 in the register 32. The communication unit 34 of the digital processing circuit 30 reads and writes data on the register 32 in response to a command from the MCU 40. For example, in response to a READ command transmitted from the MCU 40 via I2C communication, the communication unit 34 reads various items of information stored in the register 32, and transmits the information to the MCU 40 via I2C communication.

Note that the communication unit 34 is an example of a "checksum addition device", and has a function of adding a checksum. The communication unit 34 adds a checksum (CRC (Cyclic Redundancy Check) for I2C communication) to data read from the register 32, and transmits the data and the checksum to the MCU 40. In particular, the communication unit 34 according to the present embodiment can add a checksum to data by using an addition method that varies depending on the type of command.

(Functional Configuration of Communication Unit 34)

Figure 2:
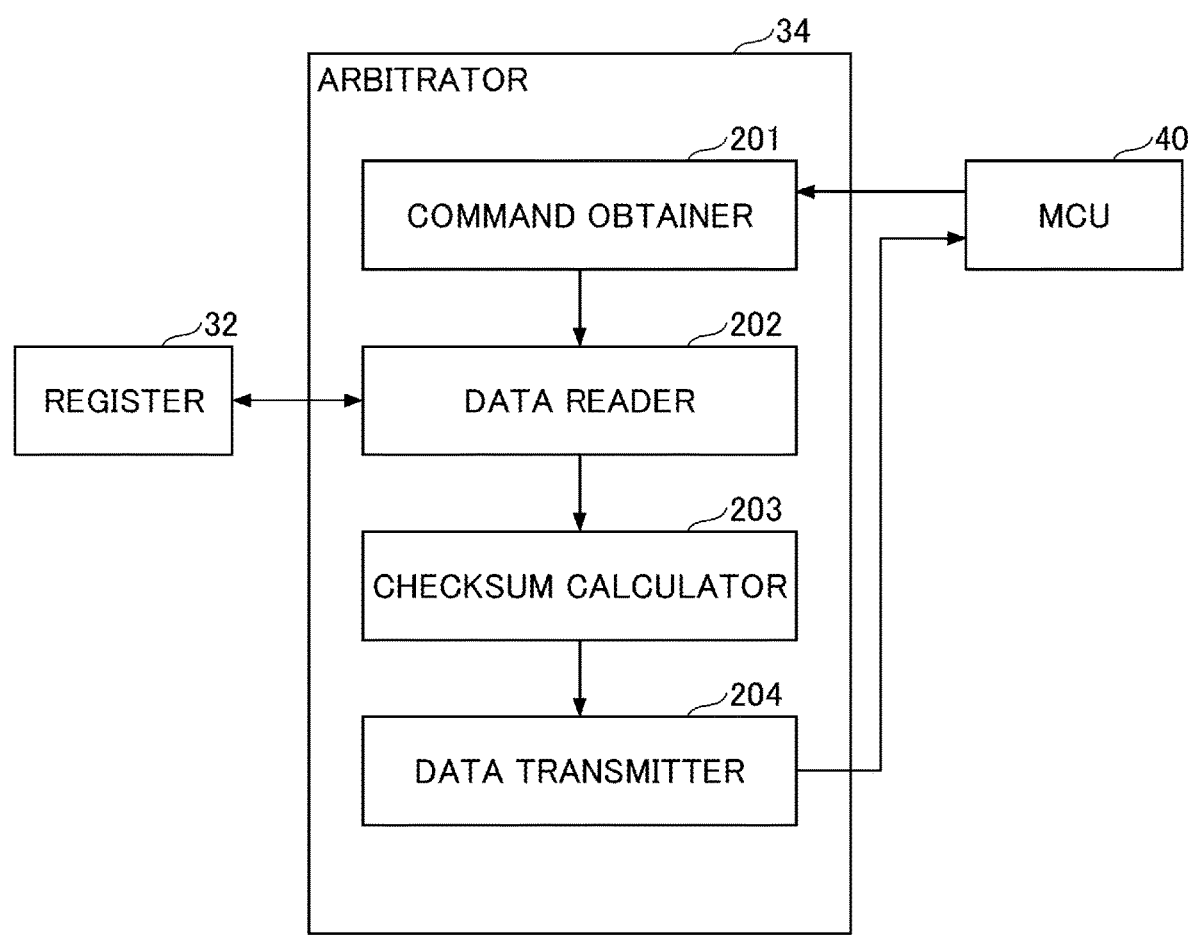
FIG. 2 is a diagram illustrating a functional configuration of a communication unit according to the one embodiment.

FIG. 2 is a diagram illustrating a functional configuration of the communication unit 34 according to the one embodiment. As illustrated in FIG. 2, the communication unit 34 includes a command obtainer 201, a data reader 202, a checksum calculator 203, and a data transmitter 204.

The command obtainer 201 obtains a command and an address transmitted from the MCU 40 via I2C communication with the MCU 40.

The data reader 202 reads data from the address of the register 32 obtained by the command obtainer 201 according to the command obtained by the command obtainer 201.

The checksum calculator 203 calculates a checksum to be added to the data read by the data reader 202.

The data transmitter 204 transmits the data read by the data reader 202 and the checksum calculated by the checksum calculator 203 to the MCU 40 via I2C communication with the MCU 40.

(Steps of Checksum Addition Method Executed by Communication Unit 34)

Figure 3:
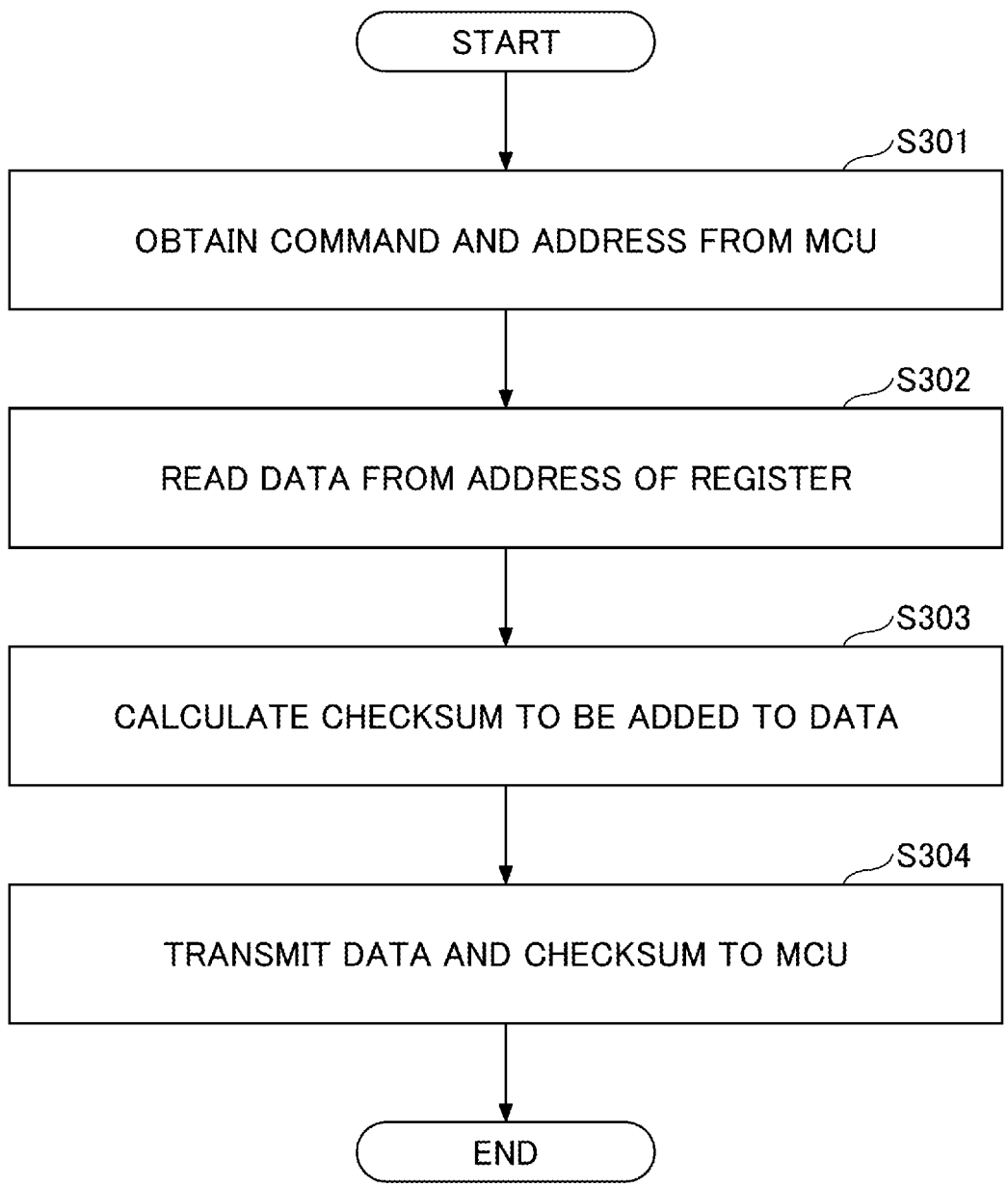
FIG. 3 is a flow chart illustrating steps of a checksum addition method executed by the communication unit according to the one embodiment.

FIG. 3 is a flow chart illustrating steps of a checksum addition method executed by the communication unit 34 according to the one embodiment.

First, the command obtainer 201 obtains a command and an address transmitted from the MCU 40 (Step S301: command obtaining step).

Next, according to the command obtained at Step S301, the data reader 202 reads data from the address of the register 32 obtained at Step S301 (Step S302: data reading step).

Next, the checksum calculator 203 calculates a checksum to be added to the data read at Step S302 (Step S303: checksum calculating step).

Next, the data transmitter 204 transmits the checksum and the date to the MCU 40 (Step S304: data transmitting step). Then, the communication unit 34 ends the series of steps illustrated in FIG. 3.

Here, in the present embodiment, at the checksum calculating step of Step S303, the checksum calculator 203 calculates a checksum in a data unit according to the type of command obtained at Step S301.

For example, in the case where the command obtained at Step S301 is a READ command (an example of a "first read command"), the data reader 202 reads one item of data in a predetermined data unit (eight bits) from the address of the register 32 obtained at Step S301. Then, the checksum calculator 203 calculates the checksum for the one item of data read from the register 32.

Also, for example, in the case where the command obtained at Step S301 is a BURST READ command (an example of a "second read command"), the data reader 202 reads multiple items of data each in a predetermined data unit (eight bits) from the address of the register 32 obtained at Step S301. Then, the checksum calculator 203 calculates the checksum for each of the multiple items of data read from the register 32.

Also, for example, in the case where the command obtained at Step S301 is a RESULT READ command (an example of a "third read command"), the data reader 202 reads one group of data including multiple items of data each in a predetermined data unit (eight bits) from the address of the register 32 obtained at Step S301. Then, the checksum calculator 203 calculates the checksum for the one group of data read from the register 32.

Further, in the present embodiment, at the checksum calculating step of Step S303, the checksum calculator 203 calculates the checksum for calculation targets including the command obtained at Step S301, the address obtained at Step S301, and the data read at Step S302.

(First Example of Communication Data)

Figure 4:
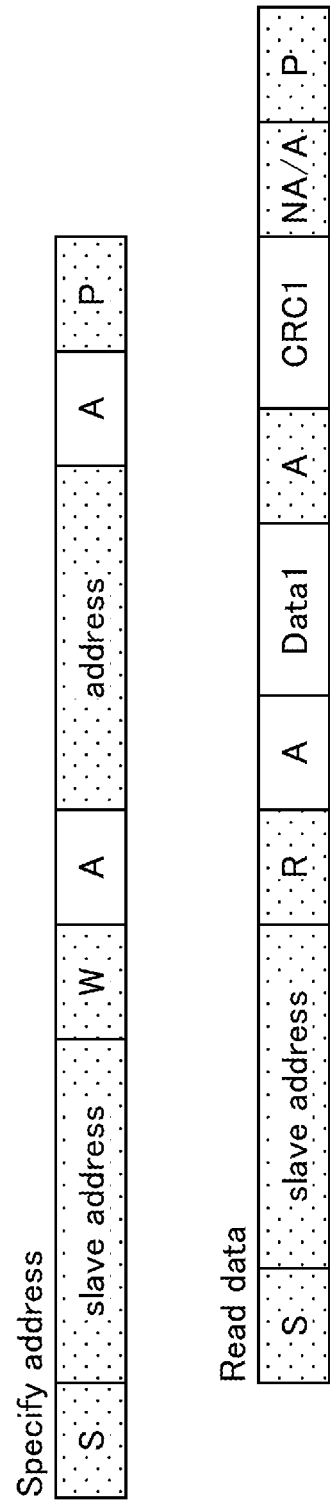
FIG. 4 is a diagram illustrating a first example of communication data transmitted and received by the communication unit according to the one embodiment.

FIG. 4 is a diagram illustrating a first example of communication data transmitted and received by the communication unit 34 according to the one embodiment. This first example illustrates communication data and communication order transmitted and received between the communication unit 34 and the MCU 40 in the case where a READ command is transmitted from the MCU 40.

Figure 5:
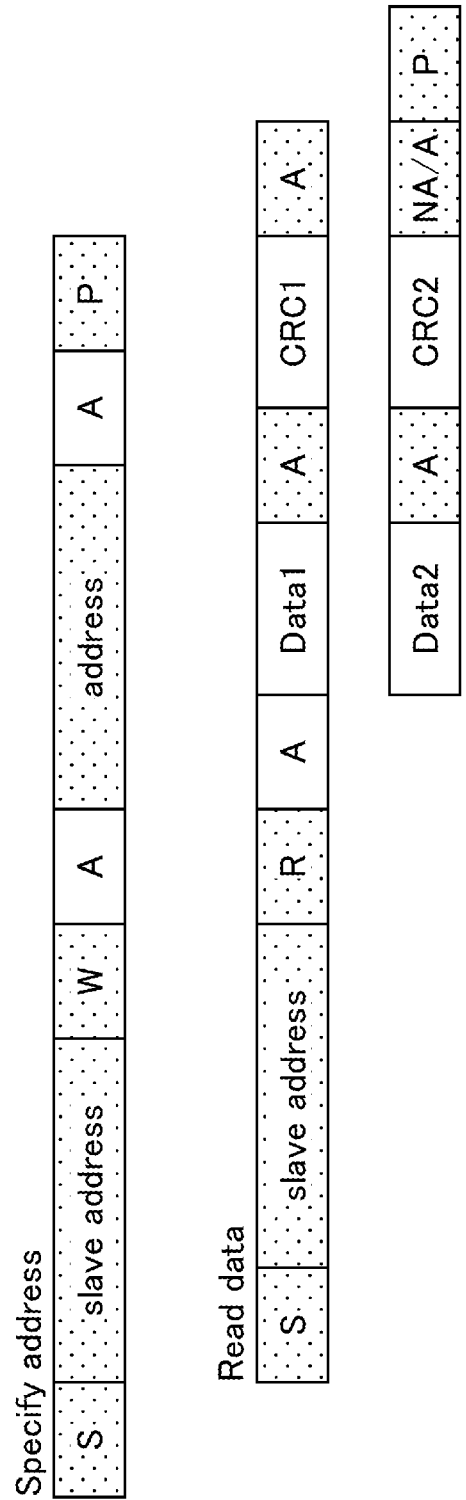
FIG. 5 is a diagram illustrating a second example of communication data transmitted and received by the communication unit according to the one embodiment.
Figure 6:
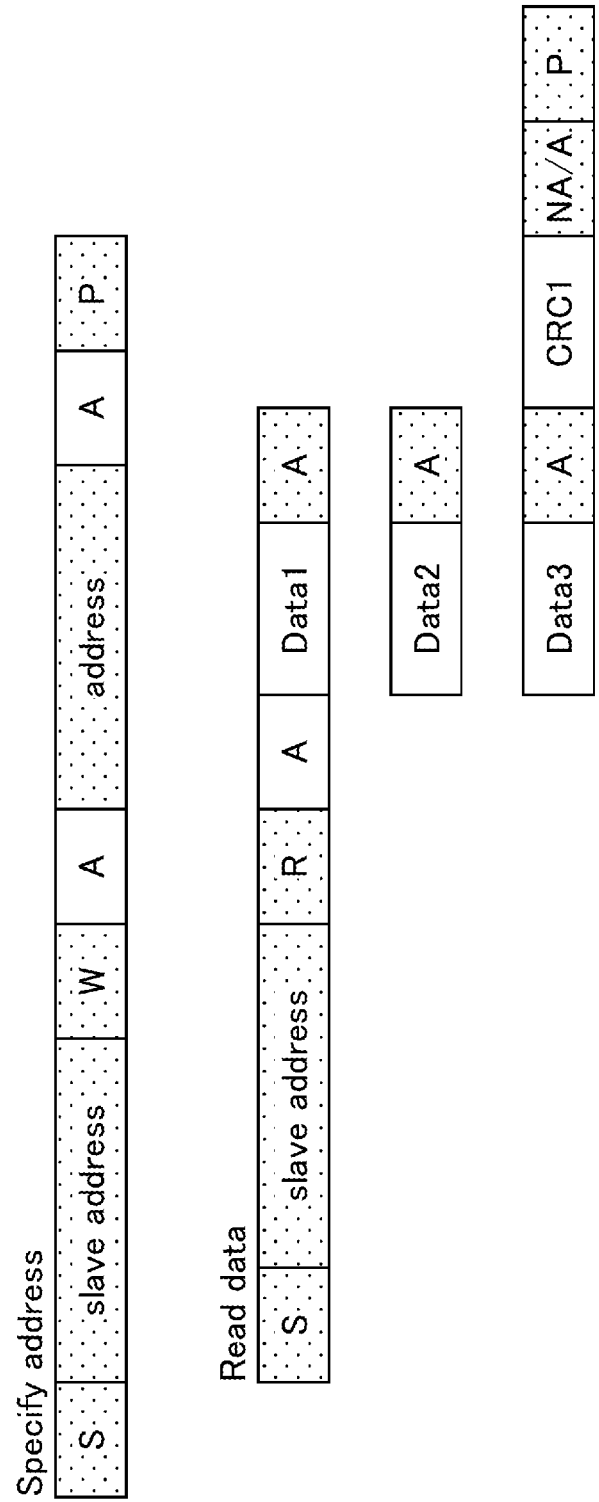
FIG. 6 is a diagram illustrating a third example of communication data transmitted and received by the communication unit according to the one embodiment.

Note that in FIGS. 4 to 6, colored data represents data transmitted from the MCU 40 to the communication unit 34, and uncolored data represents data transmitted from the communication unit 34 to the MCU 40.

In the first example illustrated in FIG. 4, first, the MCU 40 transmits a register address (address) of the register 32 in which data to be read is stored, to the communication unit 34, following a slave address. Note that the slave address is an address specific to the IC 20. Next, the MCU 40 transmits a READ command (R) to the communication unit 34 following the slave address.

Next, in response to receiving the READ command (R), the communication unit 34 reads one item of data (Data 1) in the predetermined data unit (eight bits) from the specified address of the register 32. Then, the communication unit 34 calculates a checksum (CRC 1) by using the data (Data 1) read from the register 32, the slave address, the register address (address), and the command (R) as the calculation targets. Further, the communication unit 34 transmits the one item of data (Data 1) to the MCU 40, and then, transmits the checksum (CRC 1) to the MCU 40.

(Second Example of Communication Data)

FIG. 5 is a diagram illustrating a second example of communication data transmitted and received by the communication unit 34 according to the one embodiment. This second example illustrates communication data and communication order transmitted and received between the communication unit 34 and the MCU 40 in the case where a BURST READ command is transmitted from the MCU 40.

In the second example illustrated in FIG. 5, first, the MCU 40 transmits a register address (address) of the register 32 in which data to be read is stored, to the communication unit 34, following a slave address. Next, the MCU 40 transmits a BURST READ command (R) to the communication unit 34 following the slave address.

Next, in response to receiving the BURST READ command (R), the communication unit 34 reads multiple items of data (Data 1 and Data 2) each in the predetermined data unit (eight bits) from the specified address of the register 32. Then, the communication unit 34 calculates the respective checksums (CRC 1 and CRC 2) for the multiple items of data (Data 1 and Data 2) read from the register 32. At this time, for the checksum (CRC 1) of the first data (Data 1), the communication unit 34 calculates a checksum (CRC 1) by using the first data (Data 1), the slave address, the register address (address), and the command (R) as the calculation targets. Further, the communication unit 34 sequentially transmits the first data (Data 1), the checksum (CRC 1) of the first data, the second data (Data 2), and the checksum (CRC 2) of the second data to the MCU 40.

(Third Example of Communication Data)

FIG. 6 is a diagram illustrating a third example of communication data transmitted and received by the communication unit 34 according to the one embodiment. This third example illustrates communication data and communication order transmitted and received between the communication unit 34 and the MCU 40 in the case where a RESULT READ command is transmitted from the MCU 40.

In the third example illustrated in FIG. 6, first, the MCU 40 transmits a register address (address) of the register 32 in which data to be read is stored, to the communication unit 34, following a slave address. Next, the MCU 40 transmits a RESULT READ command (R) to the communication unit 34 following the slave address.

Next, in response to receiving the RESULT READ command (R), the communication unit 34 reads one group of data (24 bits) including multiple items of data (Data 1, Data 2, and Data 3) each in the predetermined data unit (eight bits) from the specified address of the register 32. Then, the communication unit 34 calculates a checksum (CRC 1) by using the one group of data read from the register 32, the slave address, the register address (address), and the command (R) as the calculation targets. Further, the communication unit 34 sequentially transmits the first data (Data 1), the second data (Data 2), the third data (Data 3), and the check sum (CRC 1) of the one group of data to the MCU 40. Note that in some cases, the communication unit 34 reads a group of data (16 bits) including multiple items of data (Data 1 and Data 2) in the predetermined data unit (eight bits) from a specified address of the register 32.

In the present embodiment, the communication unit 34 sets the initial value to "0xFF", and divides the data to be calculated (eight bits) by a generator polynomial for CRC-8 $\{X^8+X^5+X^4+1\}$, to calculate the remainder as the checksum.

Also, in the present embodiment, the communication unit 34 handles three types of READ commands (READ command, BURST READ command, and RESULT READ command) as targets of adding checksums.

(Calculation Example of Checksum)

Figure 7:
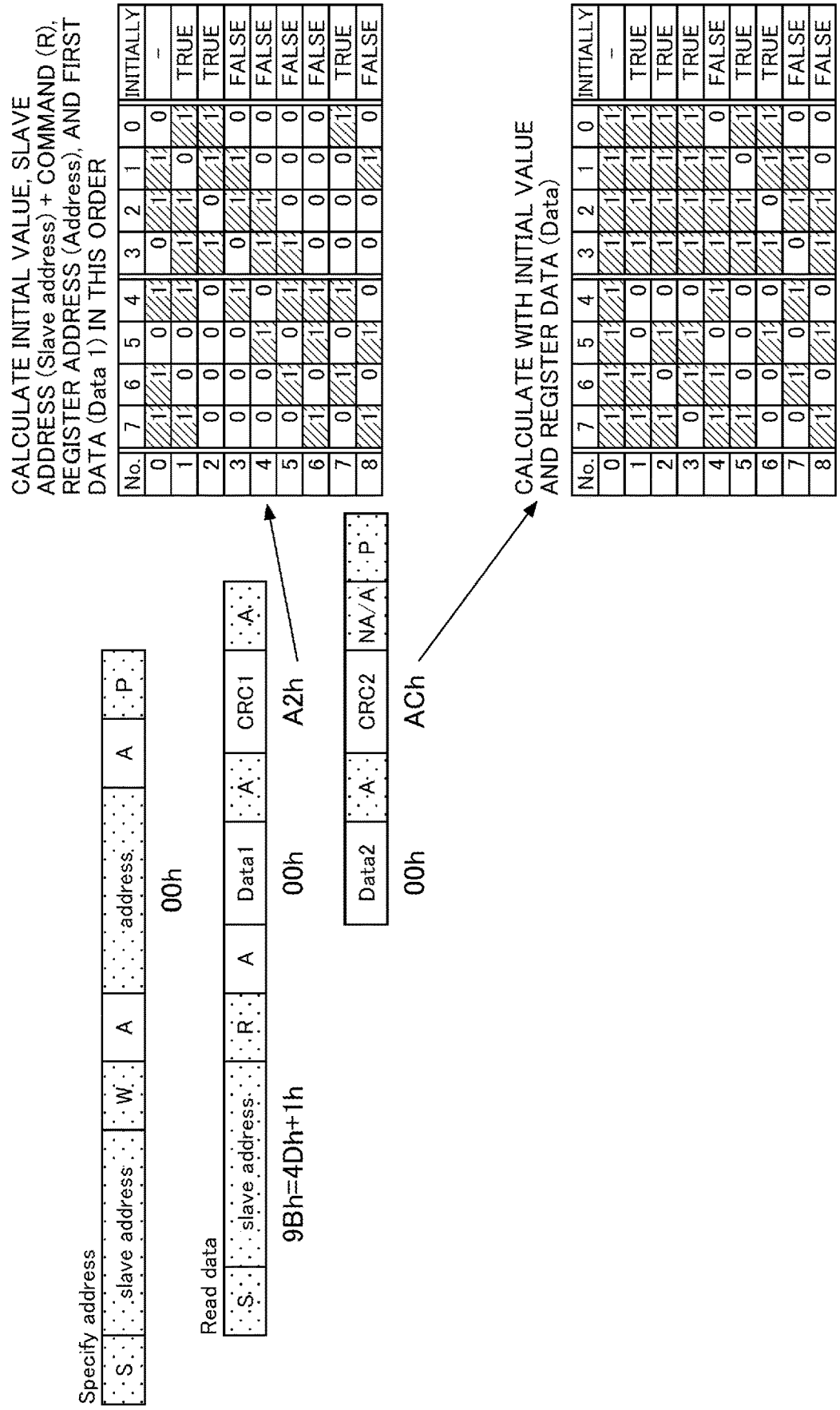
FIG. 7 is a diagram illustrating an example of calculation of a checksum by the communication unit according to the one embodiment.

FIG. 7 is a diagram illustrating an example of calculation of a checksum executed by the communication unit 34 according to the one embodiment. As one example, FIG. 7 illustrates an example in which the communication unit 34 calculates checksums (CRC 1 and CRC 2) of first data (Data 1) and second data (Data 2) read from the register 32, in response to receiving a BURST READ command (R).

In the example illustrated in FIG. 7, the communication unit 34 calculates the checksum (CRC 1) of the first data (Data 1) in the order of the initial value, the slave address+ the command (R), the register address (address), and the first data (Data 1). Note that the initial value is "0xFF", and the first data (Data 1) is "0x00". In this case, the communication unit 34 calculates "0xA2" as the checksum (CRC 1) of the first data (Data 1).

Also, in the example illustrated in FIG. 7, the communication unit 34 calculates the checksum (CRC 2) of the second data (Data 2) using the initial value and the second data (Data 2). Note that the initial value is "0xFF", and the first data (Data 2) is "0x00". In this case, the communication unit 34 calculates "0xAC" as the checksum (CRC 2) of the first data (Data 2).

As above, as described above, the communication unit 34 according to the one embodiment includes the command obtainer 201 that obtains a command and an address transmitted from the MCU 40; the data reader 202 that reads data from the address according to the command; the checksum calculator 203 that calculates a checksum to be added to the data; and the data transmitter 204 that transmits the checksum and the data to the MCU 40, wherein the checksum calculator 203 calculates the checksum in a data unit according to the type of command.

Accordingly, when transmitting to the MCU 40 data read according to a command transmitted from the MCU 40, the communication unit 34 according to the one embodiment is able to add a checksum to the data, by using a method that is more appropriate for the type of command.

Also, in the communication unit 34 according to the one embodiment, in the case where the command obtained by the command obtainer 201 is a READ command, the data reader 202 reads one item of data in the predetermined data unit (eight bits) from an address, and the checksum calculator 203 calculates a checksum for the one item of data.

Accordingly, when transmitting to the MCU 40 data read according to a READ command transmitted from the MCU 40, the communication unit 34 according to the one embodiment is able to add a checksum to the data, by using a method that is more appropriate for the READ command.

Also, in the communication unit 34 according to the one embodiment, in the case where the command obtained by the command obtainer 201 is a BURST READ command, the data reader 202 reads multiple items of data each in the predetermined data unit (eight bits) from an address, and the checksum calculator 203 calculates a checksum for each of the multiple items of data.

Accordingly, when transmitting to the MCU 40 data read according to a BURST READ command transmitted from the MCU 40, the communication unit 34 according to the one embodiment is able to add a checksum to the data, by using a method that is more appropriate for the BURST READ command.

Also, in the communication unit 34 according to the one embodiment, in the case where the command obtained by the command obtainer 201 is a RESULT READ command, the data reader 202 reads one group of data including multiple items of data each in the predetermined data unit (eight bits) from an address, and the checksum calculator 203 calculates a checksum for the one group of data.

Accordingly, when transmitting to the MCU 40 data read according to a RESULT READ command transmitted from the MCU 40, the communication unit 34 according to the one embodiment is able to add a checksum to the data, by using a method that is more appropriate for the RESULT READ command.

Also, in the communication unit 34 according to the one embodiment, the checksum calculator 203 calculates a checksum for calculation targets including a command, an address, and data.

Accordingly, the communication unit 34 according to the one embodiment is able to check a code error including the command, the address, and the data.

As above, embodiments of the present invention have been described; note that the present invention is not limited to these embodiments, and various variations or modifications can be made within the scope of the gist of the present invention as set forth in the claims.

Note that for example, the IC 20 described in the embodiment described above can be used as a what-is-called analog front end (AFE) for connecting a strain gauge that outputs an analog signal with a microcomputer that executes digital processing, in a load detection device that detects a load applied to an object. However, it is not limited as such, and the IC 20 may be connected to a sensor other than a strain gauge, and may be used in a system configuration other than the detection system 10 described in the above embodiment.

The present international application claims priority to Japanese Patent Application No. 2020-070471 filed on Apr. 9, 2020, the entire contents of which are incorporated herein by reference.

LIST OF REFERENCE NUMERALS

10 detection system (sensor system)
12, 14 sensor
20 IC
22 multiplexer
24 PGA
26 A-D converter
30 digital processing circuit
32 register
34 communication unit
40 MCU (request source, external device)

The invention claimed is:

1. A checksum addition method executed by an integrated circuit including a memory and a processor, the method comprising:
   obtaining a register address, a target address and a command transmitted from a request source, the register address being an address of a register in which data to be read is stored, the register being included in the integrated circuit, the target address being an address specific to the integrated circuit;
   reading the data from the register according to the obtained command and the register address;
   calculating a checksum to be added to the data; and
   transmitting the checksum and the data to the request source,
   wherein the checksum is calculated, in the calculating, based on the register address, the target address, the command, and the data.

2. The checksum addition method as claimed in claim 1, wherein in a case where the command obtained by the obtaining is a first read command, the reading reads one item of data in a predetermined data unit from the address, and wherein the calculating calculates the checksum for the one item of data.

3. The checksum addition method as claimed in claim 1, wherein in a case where the command obtained by the obtaining is a second read command, the reading reads multiple items of data each in a predetermined data unit from the address, and
   wherein the calculating calculates the checksum for each of the multiple items of data.

4. The checksum addition method as claimed in claim 1, wherein in a case where the command obtained by the obtaining is a third read command, the reading reads one group of data including multiple items of data each in a predetermined data unit from the address, and
   wherein the calculating calculates the checksum for the one group of data.

5. A checksum addition device, comprising:
   a memory; and
   a processor
   configured to obtain a register address, a target address and a command transmitted from a request source, the register address being an address of a register in which data to be read is stored, the register being included in the integrated circuit, the target address being an address specific to the integrated circuit;
   read the data from the register according to the obtained command and the register address;
   calculate a checksum to be added to the data; and
   transmit the checksum and the data to the request source,
   wherein the checksum is calculated, in the checksum is calculated, based on the register address, the target address, the command, and the data.

6. A sensor system comprising:
   a sensor;
   an integrated circuit including a memory; and a processor configured to execute predetermined processing on an output signal of the sensor; and
   an external device configured to obtain necessary data from the integrated circuit,
   wherein the external device transmits a command from among multiple types of commands for obtaining necessary data, and an address in which the necessary data is stored, to the integrated circuit,
   wherein the processor of the integrated circuit is configured to
   obtain a register address, a target address and a command transmitted from a request source, the register address being an address of a register in which data to be read is stored, the register being included in the integrated circuit, the target address being an address specific to the integrated circuit;
   read the data from the register according to the obtained command and the register address;
   calculate a checksum to be added to the data; and
   transmit the checksum and the data to the request source, and
   wherein the checksum is calculated based on the register address, the target address, the command, and the data.

* * * * *